(12) United States Patent
Wu et al.

(10) Patent No.: US 7,380,195 B1
(45) Date of Patent: May 27, 2008

(54) ERROR CORRECTION USING ERROR DETECTION CODES

(75) Inventors: Zining Wu, Los Altos, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 11/785,538

(22) Filed: Apr. 18, 2007

Related U.S. Application Data

(62) Division of application No. 10/752,339, filed on Jan. 6, 2004, now Pat. No. 7,228,485.

(60) Provisional application No. 60/460,437, filed on Apr. 3, 2003.

(51) Int. Cl.
*H03M 13/00* (2006.01)

(52) U.S. Cl. ....................... 714/753; 714/782

(58) Field of Classification Search ........... 714/753
See application file for complete search history.

(56) References Cited

U.S. PATENT DOCUMENTS

| 5,027,357 | A | 6/1991 | Yu et al. |
|---|---|---|---|
| 5,157,669 | A | 10/1992 | Yu et al. |
| 5,341,384 | A | 8/1994 | Miya et al. |
| 5,465,260 | A | 11/1995 | Zook |
| 5,629,949 | A | 5/1997 | Zook |
| 5,734,663 | A | 3/1998 | Eggenberger |
| 5,910,182 | A | 6/1999 | Dent et al. |
| 5,935,269 | A | 8/1999 | Kodama et al. |
| 6,092,231 | A | 7/2000 | Sze |
| 6,530,060 | B1 | 3/2003 | Vis et al. |
| 6,615,387 | B1 * | 9/2003 | Williamson et al. ........ 714/785 |

FOREIGN PATENT DOCUMENTS

EP 0292966 * 11/1988

OTHER PUBLICATIONS

Wicker, "Error Control Systems for Digital Communication and Storage," 1995, pp. 99-128, Prentice-Hall, Englewood Cliffs, NJ.
Wu, et al., "Interleaved Parity Check Codes and Reduced Complexity Detection," 1999, pp. 1-5, IEEE, USA.
Hagenauer et al. "A Viterbl Algorithm with Soft-Decision Outputs and Its Applications," 1989, pp. 1680-1686, IEEE, USA.

* cited by examiner

*Primary Examiner*—Shelly Chase

(57) ABSTRACT

A method, apparatus, and computer-readable media comprises receiving a detected sequence representing a signal on a channel, wherein the detected sequence comprises data bits and one or more error detection code bits; receiving one or more error indications for the detected sequence, each of the one or more error indications identifying one of the data bits of the detected sequence that may have an erroneous value; detecting errors in the detected sequence based on the error detection code bits in the detected sequence; and generating a candidate sequence based on the detected sequence and the one or more error indications when errors are detected in the detected sequence.

27 Claims, 16 Drawing Sheets

US 7,380,195 B1

ERROR CORRECTION USING ERROR DETECTION CODES

CROSS-REFERENCE TO RELATED APPLICATIONS

This application claims priority and the benefit thereof from U.S. Utility patent application Ser. No. 10/752,339, filed Jan. 6, 2004 and now issued as U.S. Pat. No. 7,228,485, entitled "ERROR CORRECTION USING ERROR DETECTION CODES," which claims priority and the benefit thereof from U.S. Provisional Patent Application Ser. No. 60/460,437, filed Apr. 3, 2003 entitled "ERROR CORRECTION METHOD FOR HARD DISK DRIVES USING THE EXISTING CRC CODES," the disclosures thereof incorporated by reference herein in their entirety.

BACKGROUND

The present invention relates generally to error correction for digital data. More particularly, the present invention relates to the use of error detection codes to correct errors in digital data.

FIG. 1 shows a conventional write channel 100 for writing data to a hard disk 102. Write channel 100 comprises a cyclic redundancy check (CRC) encoder 104, a Reed-Solomon (RS) encoder 106, and a channel encoder 108.

FIG. 2 shows a conventional write process 200 for write channel 100 of FIG. 1. CRC encoder 104 encodes user data u (step 202) using a CRC code to create CRC codeword bc, which comprises user data u and CRC bits c. RS encoder 106 encodes CRC codeword bc (step 204) using a RS code to create RS codeword brs, which comprises user data u, CRC bits c, and RS bits r. Channel encoder 108 encodes RS codeword brs (step 206) using a channel code such as a run-length limited (RLL) code to create channel codeword br11, which is written to disk 102 (step 208).

FIG. 3 shows a conventional permuted write channel 300 for writing data to a hard disk 302. Write channel 300 comprises a CRC encoder 304, a RS encoder 306, channel encoders 308 and 310, and a multiplexer 312.

FIG. 4 shows a conventional write process 400 for permuted write channel 300 of FIG. 3. Channel encoder 308 encodes user data u (step 402) using a channel code such as a RLL code to create channel codeword br1. CRC encoder 304 encodes channel codeword br1 (step 404) using a CRC code to create CRC codeword bc, which comprises channel codeword br1 and CRC bits c. RS encoder 306 encodes CRC codeword bc (step 406) using a RS code to create RS bits r.

Both RS encoder 306 and CRC encoder 304 are systematic encoders. Therefore, the RLL constraints in br1 are preserved after the CRC and RS encoding. The CRC bits c and RS bits r are then encoded by channel encoder 310 (step 408) to ensure good RLL properties in those bits, thereby generating channel codeword br2. Multiplexer 312 codewords br1 and br2 as channel codeword bd before writing the channel codeword bd to disk 302 (step 410).

The purpose of the CRC code in conventional systems is to detect any remaining error after the RS decoding when reading the data back from the disk. The CRC encoder calculates the CRC bits c based on the user data u and a pre-selected generating polynomial. In the read channel, if the CRC bits c agree with the data bits after RS decoding, the RS decoding result is considered correct. Otherwise, a RS decoding error flag is raised.

FIG. 5 shows a conventional read channel 500 that can be used to read data from a hard disk 502 that was written by a conventional write channel such as write channel 100 of FIG. 1. Read channel 500 comprises a channel detector 504, a channel decoder 506, a RS decoder 508, and a CRC decoder 510.

FIG. 6 shows a conventional read process 600 for read channel 500 of FIG. 5. Channel detector 504 receives a signal from disk 502. For example, the signal can be produced by a head moving over data recorded on hard disk 502. Channel detector 504 produces a detected sequence of digital data (step 602), sometimes referred to as "hard decisions," based on the signal received from hard disk 502, according to conventional techniques such as Viterbi detection.

Channel decoder 506 decodes the detected sequence (step 604) according to a channel code, which often includes a run-length limited (RLL) code and a parity code. RS decoder 508 decodes the output of channel decoder 506 (step 606). CRC decoder 510 decodes the output of RS decoder 508 (step 608).

FIG. 7 shows a conventional permuted read channel 700 that can be used to read data from a hard disk 502 that was written by a conventional permuted write channel such as write channel 300 of FIG. 3. Read channel 700 comprises a channel detector 504, channel decoders 506 and 706, a RS decoder 508, and a CRC decoder 510.

FIG. 8 shows a conventional read process 800 for read channel 500 of FIG. 5. Channel detector 504 receives a signal from disk 502. For example, the signal can be produced by a head moving over data recorded on hard disk 502. Channel detector 504 produces a detected sequence of digital data (step 802), sometimes referred to as "hard decisions," based on the signal received from hard disk 502, according to conventional techniques such as Viterbi detection.

Channel decoder 506 decodes the detected sequence (step 804) according to a channel code, which often includes a run-length limited (RLL) code and a parity code. RS decoder 508 decodes the output of channel decoder 506 (step 806). CRC decoder 510 decodes the output of RS decoder 508 (step 808). Channel decoder 506 decodes the output of CRC decoder 510 according to the channel code (step 810).

In a conventional permuted read channel 700 (FIG. 7), channel decoder 706 decodes the channel detector output according to the channel code, such as parity code, and it also decodes CRC/RS bits according to RLL codes, i.e., restore c and r from br2 (FIG. 3); channel decoder 506 decodes RLL codes only.

SUMMARY

In general, in one aspect, the invention features a method, apparatus, and computer-readable media. It comprises receiving a detected sequence representing a signal on a channel, wherein the detected sequence comprises data bits and one or more error detection code bits; receiving one or more error indications for the detected sequence, each of the one or more error indications identifying one of the data bits of the detected sequence that may have an erroneous value; detecting errors in the detected sequence based on the error detection code bits in the detected sequence; and generating a candidate sequence based on the detected sequence and the one or more error indications when errors are detected in the detected sequence.

Particular implementations can include one or more of the following features. Generating the candidate sequence comprises changing the values of the data bits identified by one or more of the one or more error indications. The candidate sequence comprises one or more error detection code bits, further comprising detecting one or more errors in the candidate sequence using the one or more error detection code bits in the candidate sequence; and generating a further candidate sequence based on the detected sequence and the one or more error indications when one or more errors are detected in the candidate sequence. Implementations comprise decoding the one or more error detection bits in the candidate sequence according to a channel code before detecting the one or more errors in the candidate sequence using the one or more error detection code bits in the candidate sequence. The candidate sequence comprises one or more error correction code bits, further comprising correcting errors in the candidate sequence based on the one or more error correction code bits. The candidate sequence comprises one or more error detection code bits, further comprising detecting errors in the candidate sequence based on the one or more error detection code bits in the candidate sequence after correcting the errors in the candidate sequence. Implementations comprise decoding the candidate sequence according to a channel code after correcting the errors in the candidate sequence. Correcting errors in the candidate sequence comprises decoding the candidate sequence using a Reed-Solomon decoder. Correcting errors in the candidate sequence comprises correcting errors in the candidate sequence based on the error correction code bits in the candidate sequence and error correction code bits in n other candidate sequences, wherein n is greater than, or equal to, one, and wherein each of the n+1 candidate sequences is based on a different detected sequence. Implementations comprise decoding the one or more error detection bits according to a channel code before detecting the one or more errors in the detected sequence using the one or more error detection code bits in the detected sequence. Implementations comprise generating the detected sequence based on the signal on the channel. The channel comprises a data storage medium. The data storage medium comprises a hard disk drive. Detecting errors in the detected sequence is selected from the group consisting of decoding the detected sequence using a cyclic redundancy check code; decoding the detected sequence using a Bose-Chaudhuri-Hochquenghem code; and decoding the detected sequence using a Hamming code.

In general, in one aspect, the invention features a method, apparatus, and computer-readable media. It comprises producing n error detection codewords based on user data, wherein n is greater than one, wherein each of the n error detection codewords comprises a portion of the user data and one or more error detection bits based on the portion of the user data, and wherein errors introduced to each of the n error detection codewords can be detected using the one or more error detection bits in the error detection codeword; and producing one error correction codeword, wherein the error correction codeword comprises the n error detection codewords and one or more error correction bits based on the n error detection codewords, and wherein errors introduced to the n error detection codewords can be corrected using the one or more error correction bits in the error correction codeword.

Particular implementations can include one or more of the following features. Implementations comprise encoding the one or more error correction bits using an error detection code. Implementations comprise producing a channel codeword based on the error correction codeword. Implementations comprise writing the channel codeword to a channel. The channel comprises a data storage medium. The data storage medium comprises a hard disk. Producing the one error correction codeword comprises encoding the user data using a Reed-Solomon code. Producing the n error detection codewords is selected from the group consisting of encoding the user data using a cyclic redundancy check code; encoding the user data using a Bose-Chaudhuri-Hochquenghem code; and encoding the user data using a Hamming code.

The details of one or more implementations are set forth in the accompanying drawings and the description below. Other features will be apparent from the description and drawings, and from the claims.

Some embodiments of the write channels of the present invention also encode the error correction bits using an error detection code.

Figure 15:
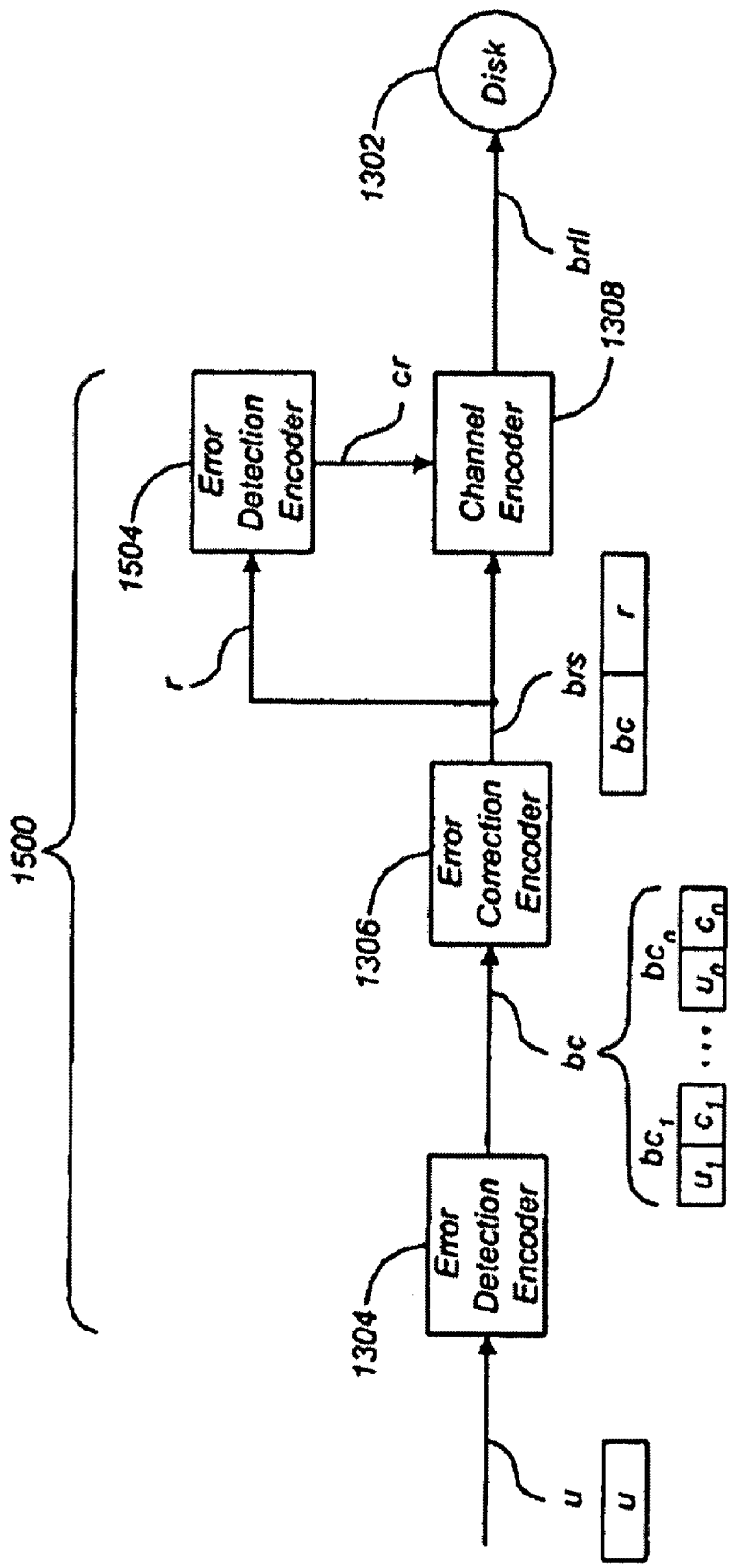

FIG. 15 shows such a write channel for writing data to a hard disk.

Figure 16:
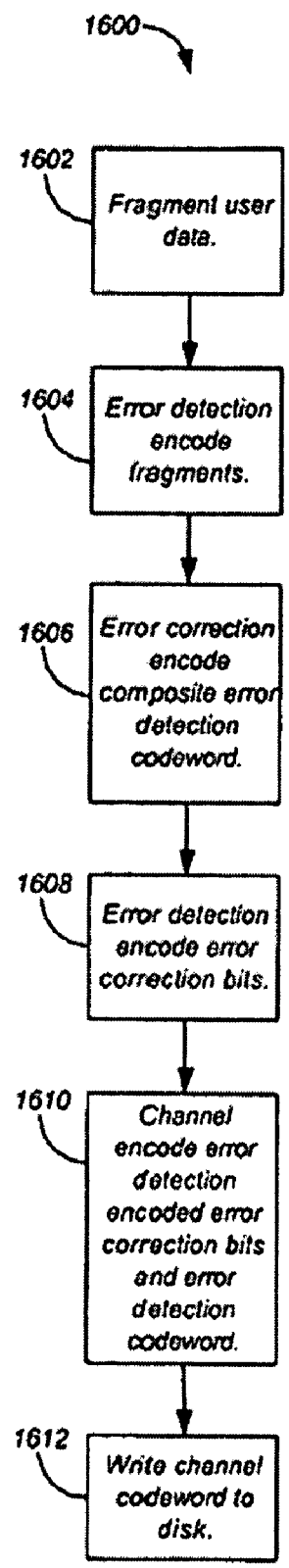

FIG. 16 shows a process for the write channel of FIG. 15 according to a preferred embodiment.

The leading digit(s) of each reference numeral used in this specification indicates the number of the drawing in which the reference numeral first appears.

DETAILED DESCRIPTION

The inventors have recognized that a read channel can be improved by using the error detection code, not only for error detection, but also for error correction. Accordingly, some embodiments of the present invention employ error detection codes such as cyclic redundancy check codes, Bose-Chaudhuri-Hochquenghem codes, and Hamming codes for error correction. Because in many cases an error detection code is already present in the channel, no additional channel overhead is incurred. Embodiments of the present invention also employ error detection codes for error detection, and employ error correction codes such as Reed-Solomon codes for error correction.

Figure 1:
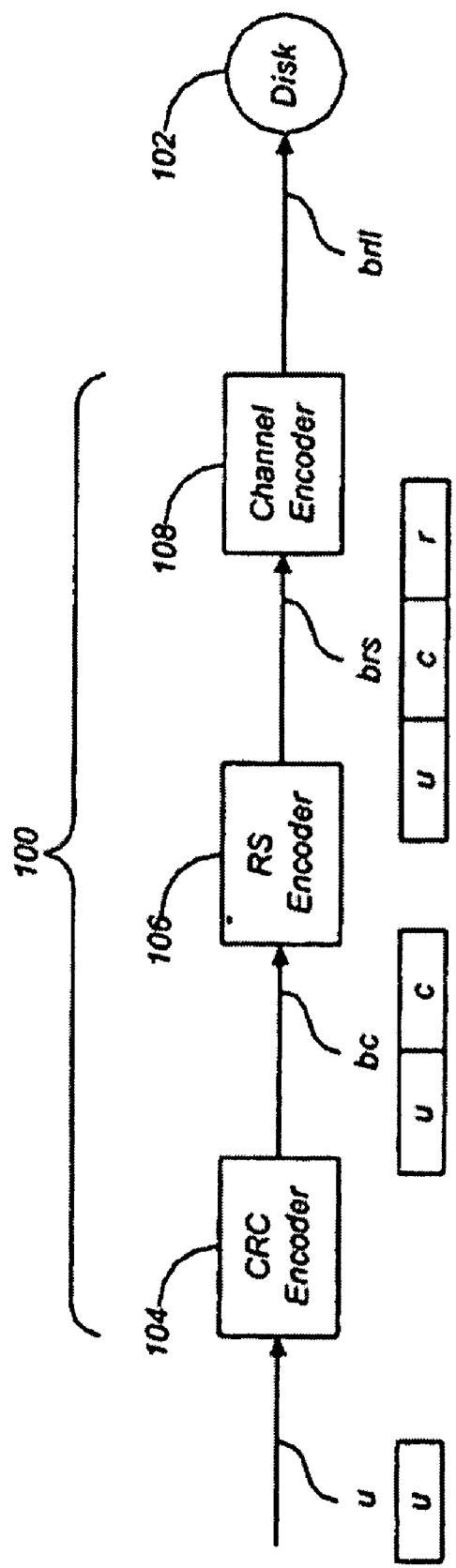
FIG. 1 shows a conventional write channel for writing data to a hard disk.
Figure 2:
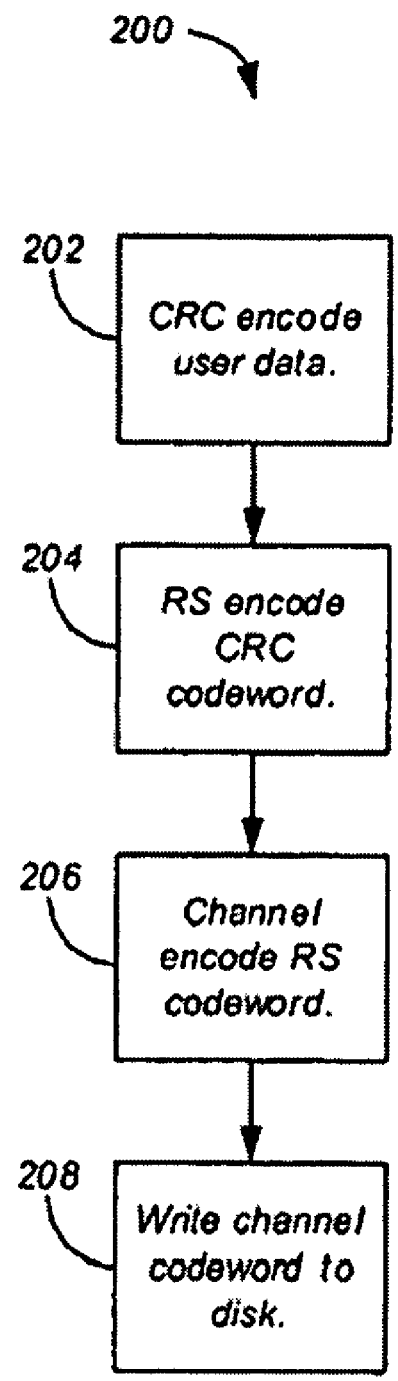
FIG. 2 shows a conventional write process for the read channel of FIG. 1.
Figure 9:
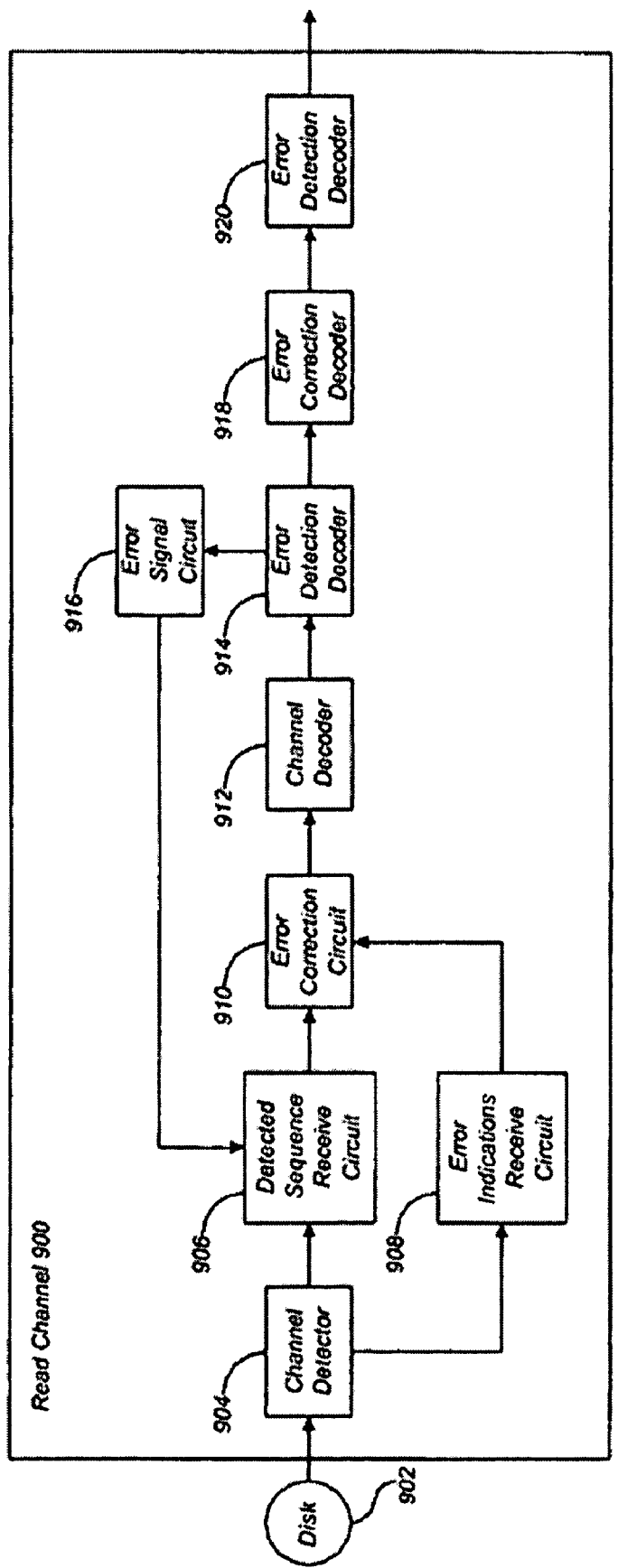
FIG. 9 shows a read channel according to a preferred embodiment that can be used to read data from a hard disk that was written by a conventional write channel such as the write channel of FIG. 1.

FIG. 9 shows a read channel 900 according to a preferred embodiment that can be used to read data from a hard disk 902 that was written by a conventional write channel such as write channel 100 of FIG. 1. While embodiments of the present invention are described with respect to a hard disk, other types of channels can be used, such as other sorts of recording media, wired and wireless channels, optical channels, and so on.

Read channel 900 comprises a channel detector 904, a detected sequence receive circuit 906, an error indications receive circuit 908, an error correction circuit 910, a channel decoder 912, error detection decoders 914 and 920, an error signal circuit 916, and an error correction decoder 918.

Figure 10:
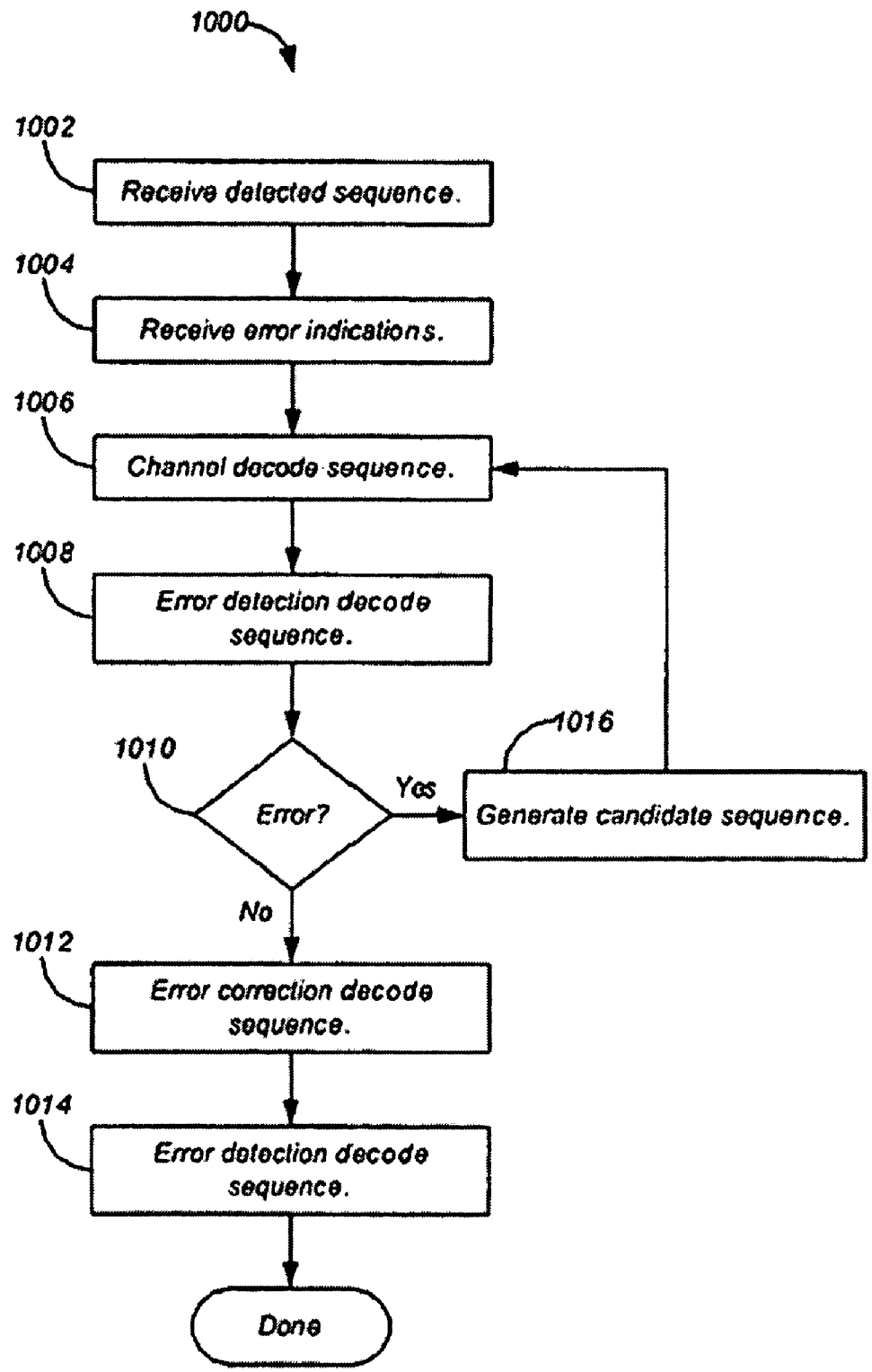
FIG. 10 shows a read process for the read channel of FIG. 9 according to a preferred embodiment.

FIG. 10 shows a read process 1000 for read channel 900 of FIG. 9 according to a preferred embodiment. Channel detector 904 receives a signal from disk 902. For example, the signal can be produced by a head moving over a sector of data recorded on disk 902. Channel detector 904 produces a detected sequence of digital data, sometimes referred to as "hard decisions," based on the signal received from disk 902, according to conventional techniques such as Viterbi detection.

Detected sequence receive circuit 906 receives the detected sequence (step 1002). Channel detector 904 also produces one or more error indications for the detected sequence according to conventional techniques. One way to generate the error indications is to use a post processor where the penalty metrics at the output of the post-processor are inversely proportional to the possibility of error events. Therefore, the post processor can generate a list of error events with the smallest penalties for error detection decoder 914. A second method of identifying the most likely error events was presented in Z. Wu, et al., "Interleaved Parity Check Codes And Reduced Complexity Detection," Proceedings of IEEE ICC 1999, page 1648-52, where back tracing in the Viterbi detector is used in place of a post processor. A third method described in J. Hagenauer et al., "A Viterbi Algorithm With Soft-Decision Outputs And Its Applications," Proceedings of IEEE Globecom 1989, page 1680-86 uses soft-output Viterbi detector (SOVA) to obtain the reliability information for the hard decisions, and uses the reliability information to identify the most likely errors. However, embodiments of the present invention do not depend on a particular method for generating error indications.

Each error indication identifies one or more of the bits in the detected sequence that may be in error. Error indications receive circuit 908 receives the error indications (step 1004). Preferably error indications receive circuit 908 comprises a memory for storing the error indications.

Channel decoder 912 decodes the detected sequence (step 1006) according to a channel code, which preferably includes a run-length limited (RLL) code and a parity code. Error detection decoder 914 decodes the output of channel decoder 912 (step 1008) according to an error detection code such as a cyclic redundancy check (CRC) code. Of course other error detection codes can be used, such as Bose-Chaudhuri-Hochquenghem codes and Hamming codes.

If error detection decoder 914 detects no errors in the detected sequence (step 1010), error correction decoder 918 decodes the detected sequence (step 1012) according to an error correction code such as a Reed-Solomon code. Error detection decoder 920 decodes the output of error correction decoder 918 (step 1014) according to an error detection code such as a CRC code. Read process 1000 is then complete.

But if error detection decoder 914 detects one or more errors in the detected sequence (step 1010), error signal circuit 916 asserts an error signal. In response to the error signal, error correction circuit 910 generates a candidate sequence (step 1016) based on the detected sequence and one or more of the error indications for the detected sequence. In a preferred embodiment, error correction circuit 910 generates the candidate sequence by changing the value of one or more of the data bits in the detected sequence that are identified by the error indications.

Channel decoder 912 decodes the candidate sequence (step 1006) according to the channel code. Error detection decoder 914 decodes the output of channel decoder 912 (step 1008) according to the error detection code.

If error detection decoder 914 detects no errors in the candidate sequence (step 1010), error correction decoder 918 decodes the candidate sequence (step 1012) according to the error correction code. Error detection decoder 920 decodes the output of error correction decoder 918 (step 1014) according to the error detection code. Read process 1000 is then complete.

But if error detection decoder 914 detects one or more errors in the candidate sequence (step 1010), error signal circuit 916 again asserts the error signal. In response to the error signal, error correction circuit 910 generates a different candidate sequence (step 1016) based on the detected sequence and one or more of the error indications for the detected sequence. In a preferred embodiment, error correction circuit 910 generates each candidate sequence by changing the value of one or more of the data bits in the detected sequence that are identified by the error indications.

Read channel 900 repeats steps 1006 through 1010 until a candidate sequence has no errors, until a predetermined number of candidate sequences are generated, or until all possible candidate sequences have been tried. When decoding step 1010 finishes, the error correction decoder 918 (usually a RS decoder) decodes the output sequence from unit 914 (step 1012). Error detection decoder 920 then checks the integrity of error correction decoder 918 output (step 1014). If both step 1012 and 1014 declare valid codewords, decoding is finished; otherwise, read channel can read the data from disk 902 again, and repeat process 1000.

Figure 3:
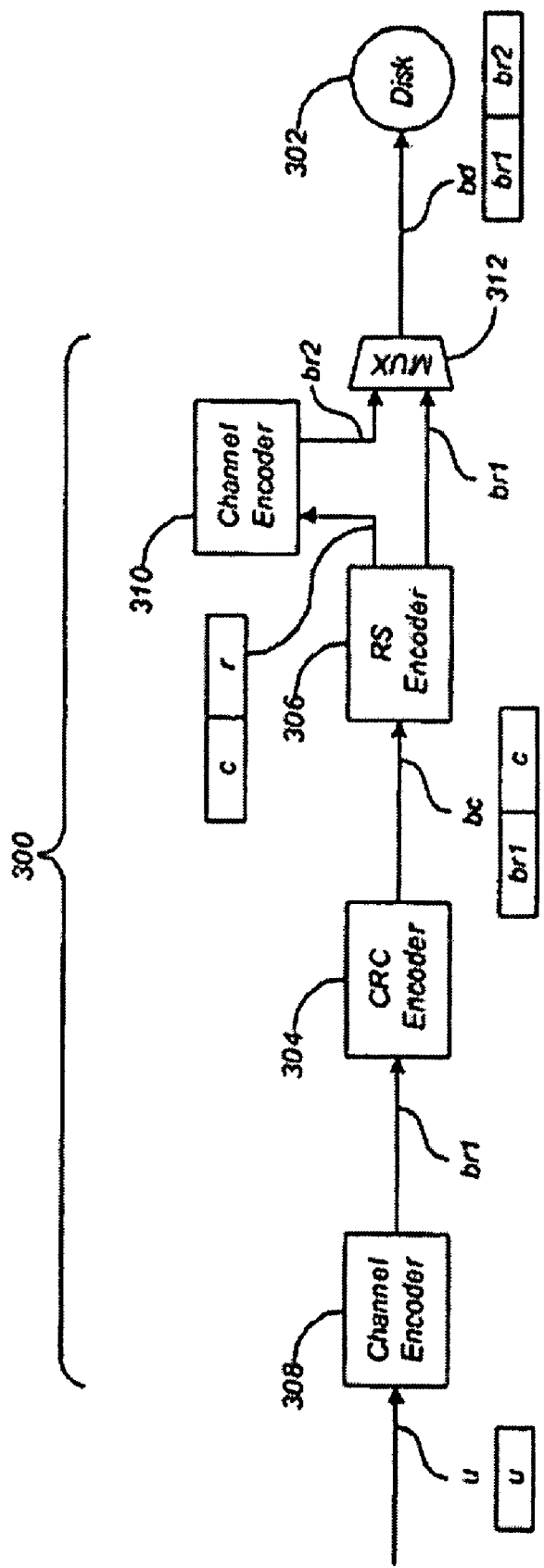
FIG. 3 shows a conventional permuted write channel for writing data to a hard disk.
Figure 4:
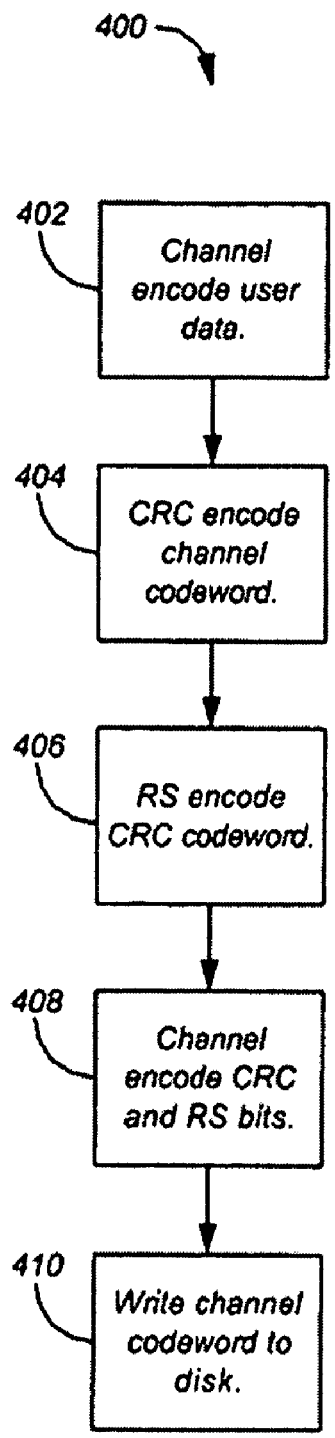
FIG. 4 shows a conventional write process for the permuted read channel of FIG. 3
Figure 5:
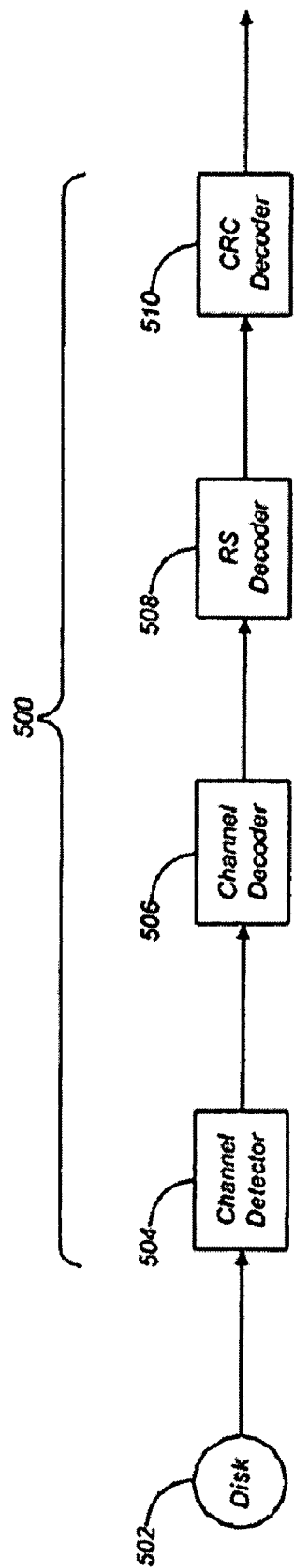
FIG. 5 shows a conventional read channel that can be used to read data from a hard disk that was written by a conventional write channel such as the write channel of FIG. 1.
Figure 6:
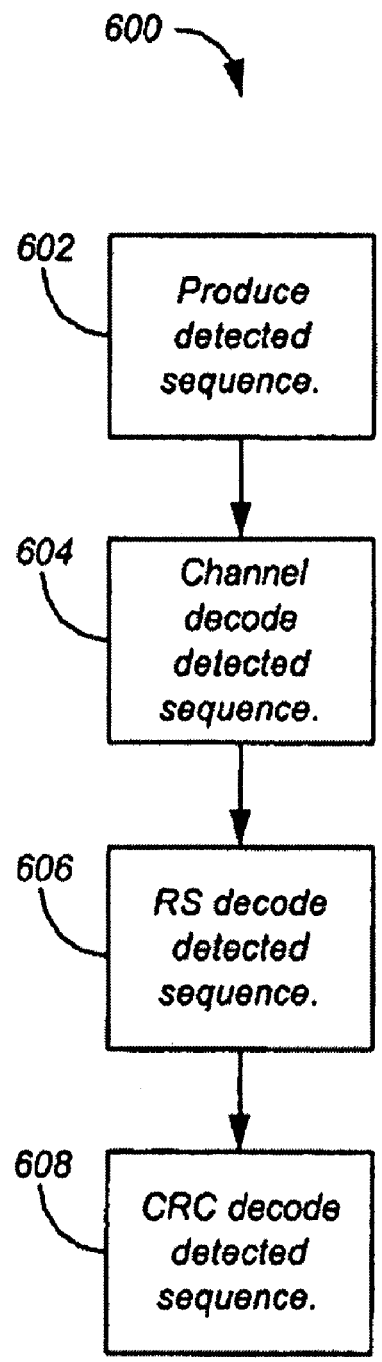
FIG. 6 shows a conventional read process for the read channel of FIG. 5.
Figure 7:
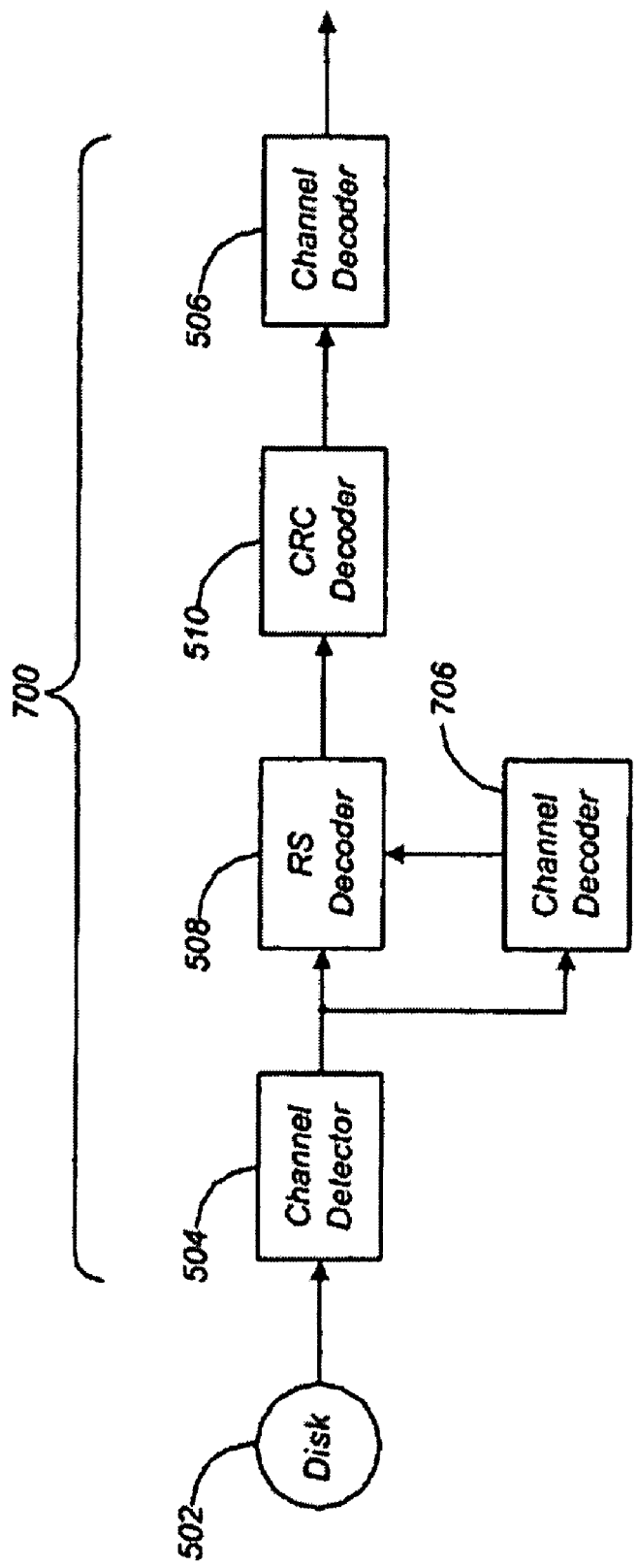
FIG. 7 shows a conventional permuted read channel that can be used to read data from a hard disk that was written by a conventional permuted write channel such as the write channel of FIG. 3.
Figure 8:
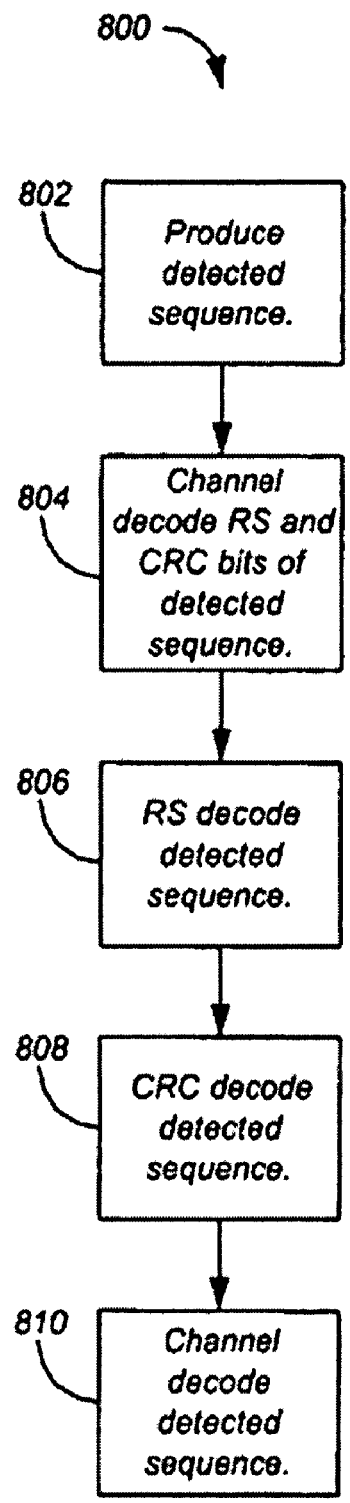
FIG. 8 shows a conventional read process for read channel of FIG. 5.
Figure 11:
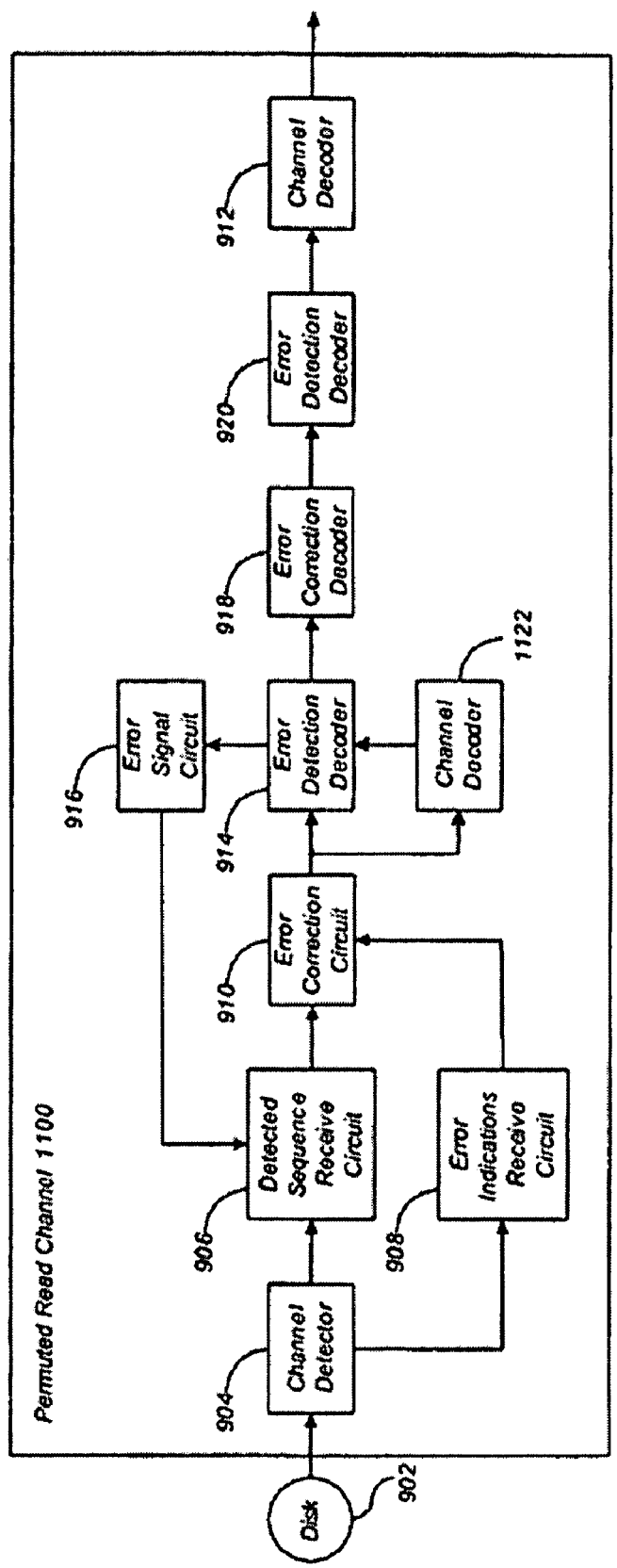
FIG. 11 shows a permuted read channel according to a preferred embodiment that can be used to read data from a hard disk that was written by a conventional permuted write channel such as the write channel of FIG. 3.

FIG. 11 shows a permuted read channel 1100 according to a preferred embodiment that can be used to read data from a hard disk 902 that was written by a conventional permuted write channel such as write channel 300 of FIG. 3. Read channel 1100 is similar to read channel 900 of FIG. 9, except for two aspects. First, channel decoder 912 has been moved to after error correction decoder 918. Channel decoder 912 performs similar function as channel decoder 506 in the prior art. Second, because the error detection bits in the detected sequence are channel encoded, they must be channel decoded before error correction decoding in error detection decoder 914. Therefore read channel 1100 includes a further channel decoder 1122 that decodes the error detection bits in the detected sequence. Similarly, the error correction bits must be channel decoded before error correction decoding in error correction decoder 918. The channel decoding of the error correction bits can be performed by channel decoder 1122, or by another channel decoder implemented before error correction decoder 918.

Figure 12:
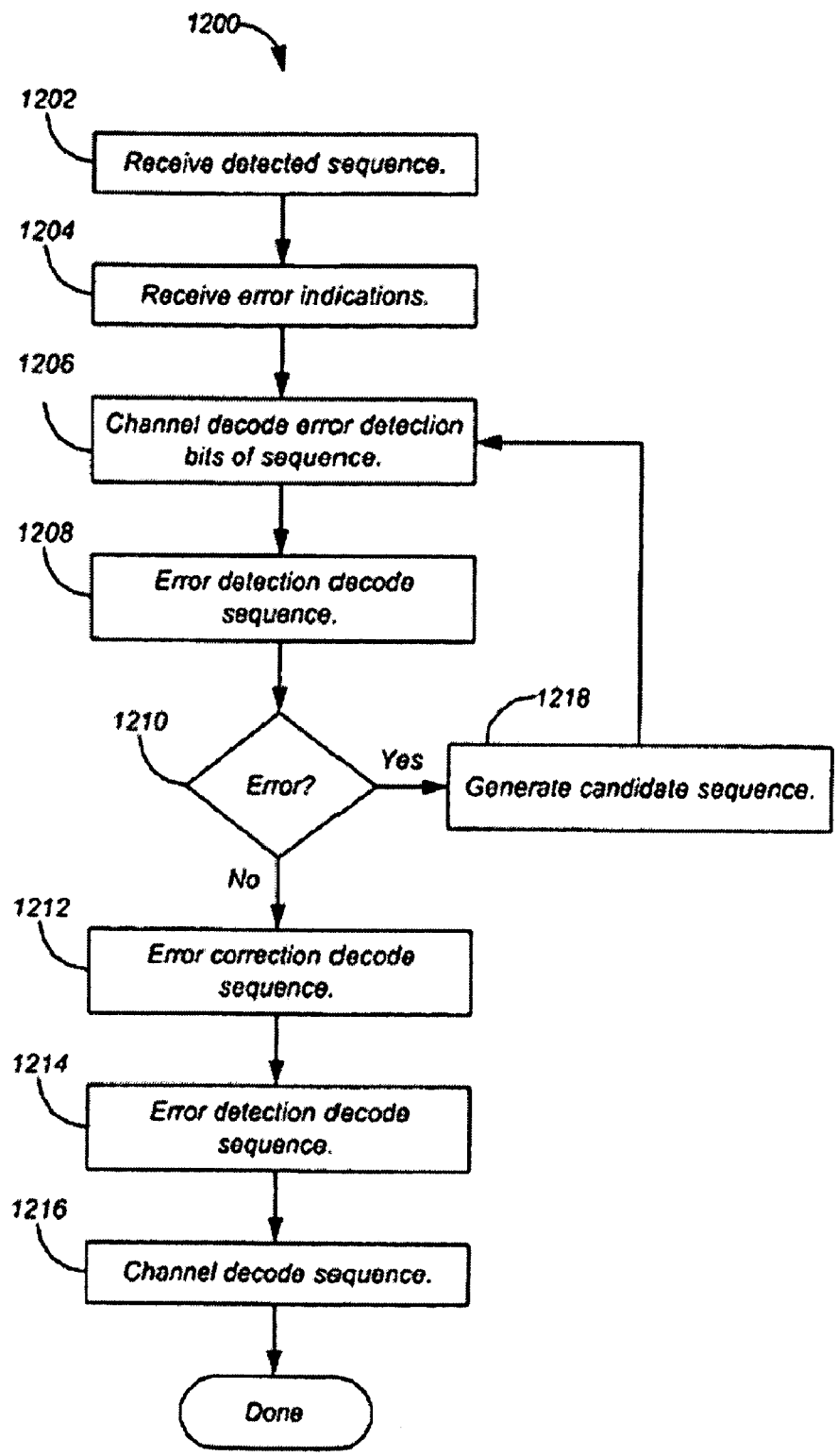
FIG. 12 shows a read process for the permuted read channel of FIG. 1

FIG. 12 shows a read process 1200 for permuted read channel 1100 of FIG. 11 according to a preferred embodiment. Channel detector 904 receives a signal from disk 902. For example, the signal can be produced by a head moving over a sector of data recorded on disk 902. Channel detector 904 produces a detected sequence of digital data, sometimes referred to as "hard decisions," based on the signal received from disk 902, according to conventional techniques such as Viterbi detection.

Detected sequence receive circuit 906 receives the detected sequence (step 1202). Channel detector 904 also produces one or more error indications for the detected sequence according to conventional techniques. Each error indication identifies one or more of the bits in the detected sequence that may be in error. Error indications receive circuit 908 receives the error indications (step 1204). Preferably error indications receive circuit 908 comprises a memory for storing the error indications.

Channel decoder 1122 decodes the error detection bits of the detected sequence (step 1206) according to a channel code, which preferably includes a run-length limited (RLL) code and a parity code. Channel decoder 912 preferably also decodes the error correction bits of the detected sequence, although that is not necessary until immediately before error correction (step 1212 discussed below).

Error detection decoder 914 decodes the detected sequence (step 1208) according to an error detection code such as a cyclic redundancy check (CRC) code. Of course other error detection codes can be used, such as Bose-Chaudhuri-Hochquenghem codes and Hamming codes.

If error detection decoder 914 detects no errors in the detected sequence (step 1210), error correction decoder 918 decodes the detected sequence (step 1212) according to an error correction code such as a Reed-Solomon code. Error detection decoder 920 decodes the output of error correction decoder 918 (step 1214) according to an error detection code such as a CRC code. Channel decoder 912 decodes the detected sequence (step 1216) according to the channel code such as a RLL code. In some embodiments channel decoders 912 and 1122 are implemented as a single unit in permuted read channel 1100. Read process 1200 is then complete.

But if error detection decoder 914 detects one or more errors in the detected sequence (step 1210), error signal circuit 916 asserts an error signal. In response to the error signal, error correction circuit 910 generates a candidate sequence (step 1218) based on the detected sequence and one or more of the error indications for the detected sequence. In a preferred embodiment, error correction circuit 910 generates the candidate sequence by changing the value of one or more of the data bits in the detected sequence that are identified by the error indications.

Channel decoder 1122 decodes the error detection bits of the candidate sequence (step 1206) according to the channel code. Error detection decoder 914 decodes the candidate sequence (step 1208) according to the error detection code.

If error detection decoder 914 detects no errors in the candidate sequence (step 1210), error correction decoder 918 decodes the candidate sequence (step 1212) according to the error correction code. Error detection decoder 920 decodes the output of error correction decoder 918 (step 1214) according to the error detection code. Channel decoder 912 decodes the candidate sequence (step 1216) according to the channel code. In some embodiments channel decoders 912 and 1122 are implemented as a single unit in permuted read channel 1100. Read process 1200 is then complete.

But if error detection decoder 914 detects one or more errors in the candidate sequence (step 1210), error signal circuit 916 again asserts the error signal. In response to the error signal, error correction circuit 910 generates a different candidate sequence (step 1218) based on the detected sequence and one or more of the error indications for the detected sequence. In a preferred embodiment, error correction circuit 910 generates each candidate sequence by changing the value of one or more of the data bits in the detected sequence that are identified by the error indications.

Read channel 900 repeats steps 1206 through 1210 and 1218 until a candidate sequence is generated that has no errors, until a predetermined number of candidate sequences are generated, or until all possible candidate sequences have been tried. When decoding step 1210 finishes, the error correction decoder 918 (usually a RS decoder) decodes the output sequence from unit 914 (step 1212). Error detection decoder 920 then checks the integrity of error correction decoder 918 output (step 1214). If both step 1212 and 1214 declare valid codewords, decoding is finished; otherwise, permuted read channel 1100 can read the data from disk 902 again, and repeat process 1200.

In some embodiments of the present invention, each error correction codeword comprises multiple error detection codewords. This feature is especially useful with embodiments such as the read channels described above because writing smaller CRC codewords results in smaller detected sequences. Because errors can be detected and corrected in these smaller chunks of data, the processing of an entire sector of data, corresponding to an error correction codeword, takes much less time. Thus data can be read from disk faster using this feature. But while this feature is especially useful with the read channel embodiments of the present invention, it does not require them, and can improve the performance of conventional read channels as well.

Figure 13:
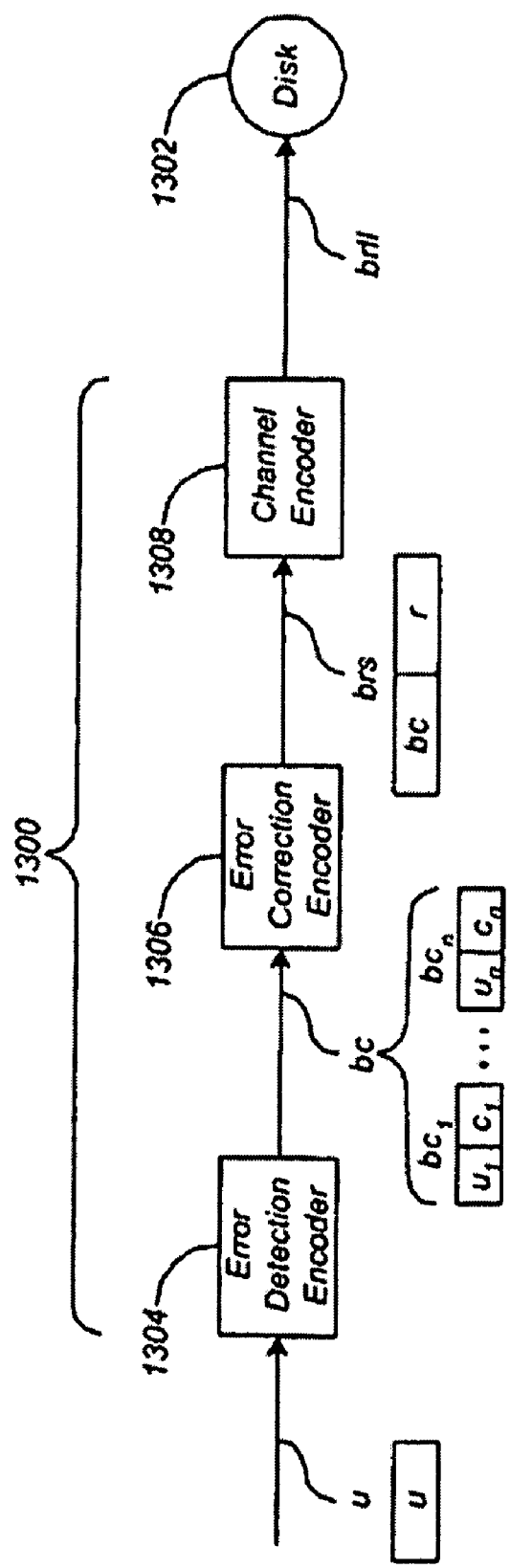
FIG. 13 shows a write channel for writing data to a disk according to a preferred embodiment.

FIG. 13 shows a write channel 1300 for writing data to a disk 1302 according to a preferred embodiment. Write channel 1300 comprises an error detection encoder 1304, an error correction encoder 1306, and a channel encoder 1308. While embodiments of the present invention are described with respect to a hard disk, other types of channels can be used, such as other sorts of recording media, wired and wireless channels, optical channels, and so on.

Figure 14:
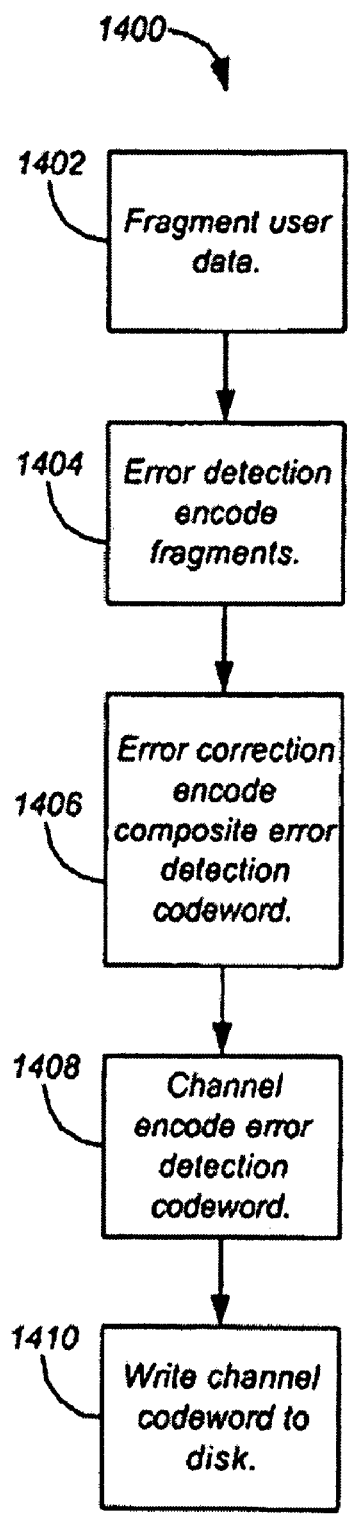
FIG. 14 shows a process for the write channel of FIG. 13 according to a preferred embodiment.

FIG. 14 shows a process 1400 for write channel 1300 of FIG. 13 according to a preferred embodiment. Error detection encoder 1304 receives user data u and fragments the user data u into n fragments $u_1$ through $u_n$ (step 1402). Error detection encoder 1304 encodes each fragment of the user data (step 1404) using an error detection code such as cyclic redundancy check codes, Bose-Chaudhuri-Hochquenghem codes, and Hamming codes to create a composite error detection codeword bc comprising n error detection codewords $bc_1$ through $bc_n$, each comprising one of the user data fragments $u_1$ through $u_n$ and corresponding error detection bits $c_1$ through $c_n$. Error correction encoder 1306 encodes the composite error detection codeword bc (step 1406) using an error correction code such as a RS code to create a single error correction codeword brs, which comprises composite error correction codeword bc and error correction bits r. Channel encoder 1308 encodes error correction codeword brs (step 1408) using a channel code such as a run-length limited (RLL) code to create channel codeword brll, which is written to disk 102 (step 1410).

Some embodiments of the write channels of the present invention also encode the error correction bits using an error detection code. FIG. 15 shows such a write channel 1500 for writing data to a hard disk 1302. While embodiments of the present invention are described with respect to a hard disk, other types of channels can be used, such as other sorts of recording media, wired and wireless channels, optical channels, and so on. Write channel 1500 comprises error detection encoders 1304 and 1504, an error correction encoder 1306, and a channel encoder 1308.

FIG. 16 shows a process 1600 for write channel 1500 of FIG. 15 according to a preferred embodiment. Error detection encoder 1304 receives user data u and fragments the user data u into n fragments $u_1$ through $u_n$ (step 1602). Error detection encoder 1304 encodes each fragment of the user data (step 1604) using an error detection code such as cyclic redundancy check codes, Bose-Chaudhuri-Hochquenghem codes, and Hamming codes to create a composite error detection codeword bc comprising n error detection codewords $bc_1$ through $bc_n$, each comprising one of the user data fragments $u_1$ through $u_n$ and corresponding error detection bits $c_1$ through $c_n$. Error correction encoder 1306 encodes the composite error detection codeword bc (step 1606) using an error correction code such as a RS code to create a single error correction codeword brs, which comprises composite error detection codeword bc and error correction bits r. Error detection encoder 1504 encodes the error correction bits r as error detection encoded error correction bits cr (step 1608). Channel encoder 1308 encodes error correction codeword brs and error detection encoded error correction bits cr (step 1610) using a channel code such as a run-length limited (RLL) code to create channel codeword br11, which is written to disk 1302 (step 1612).

The invention can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations of the invention have been described. Nevertheless, it will be understood that various modifications may be made without departing from the spirit and scope of the invention. Accordingly, other implementations are within the scope of the following claims.

The invention claimed is:

1. An apparatus comprising:
   an error detection encoder to produce n error detection codewords based on user data, wherein n is greater than one, wherein each of the n error detection codewords comprises a portion of the user data and one or more error detection bits based on the portion of the user data, and wherein errors introduced to each of the n error detection codewords can be detected using the one or more error detection bits in the error detection codeword; and
   an error correction encoder to produce an error correction codeword, wherein the error correction codeword comprises the n error detection codewords and one or more error correction bits based on the n error detection codewords, and wherein errors introduced to the n error detection codewords can be corrected using the one or more error correction bits in the error correction codeword.

2. The apparatus of claim 1, further comprising:
   a further error detection encoder to encode the one or more error correction bits using an error detection code.

3. The apparatus of claim 1, further comprising:
   a channel encoder to produce a channel codeword based on the error correction codeword.

4. The apparatus of claim 3, further comprising:
   a channel;
   wherein the channel encoder is further to write the channel codeword to the channel.

5. The apparatus of claim 4, wherein the channel comprises:
   a data storage medium.

6. The apparatus of claim 5:
   wherein the data storage medium comprises a hard disk.

7. The apparatus of claim 1, wherein the error detection encoder is selected from the group consisting of:
   a cyclic redundancy check encoder;
   a Bose-Chaudhuri-Hochquenghem encoder; and
   a Hamming encoder.

8. The apparatus of claim 1, wherein the error correction encoder comprises:
   a Reed-Solomon encoder.

9. An apparatus comprising:
   error detection encoder means for producing n error detection codewords based on user data, wherein n is greater than one, wherein each of the n error detection codewords comprises a portion of the user data and one or more error detection bits based on the portion of the user data, and wherein errors introduced to each of the n error detection codewords can be detected using the one or more error detection bits in the error detection codeword; and
   error correction encoder means for producing an error correction codeword, wherein the error correction codeword comprises the n error detection codewords and one or more error correction bits based on the n error detection codewords, and wherein errors introduced to the n error detection codewords can be corrected using the one or more error correction bits in the error correction codeword.

10. The apparatus of claim 9, further comprising:
    further error detection encoder means for encoding the one or more error correction bits using an error detection code.

11. The apparatus of claim 9, further comprising:
channel encoder means for producing a channel codeword based on the error correction codeword.

12. The apparatus of claim 11, further comprising:
channel means;
wherein the channel encoder means is further for writing the channel codeword to the channel means.

13. The apparatus of claim 9, wherein the error detection encoder means employs a code selected from the group consisting of:
a cyclic redundancy check code;
a Bose-Chaudhuri-Hochquenghem code; and
a Hamming code.

14. The apparatus of claim 9, wherein the error correction encoder code employs a Reed-Solomon code.

15. A method comprising:
producing n error detection codewords based on user data, wherein n is greater than one, wherein each of the n error detection codewords comprises a portion of the user data and one or more error detection bits based on the portion of the user data, and wherein errors introduced to each of the n error detection codewords can be detected using the one or more error detection bits in the error detection codeword; and
producing an error correction codeword, wherein the error correction codeword comprises the n error detection codewords and one or more error correction bits based on the n error detection codewords, and wherein errors introduced to the n error detection codewords can be corrected using the one or more error correction bits in the error correction codeword.

16. The method of claim 15, further comprising:
encoding the one or more error correction bits using an error detection code.

17. The method of claim 15, further comprising:
producing a channel codeword based on the error correction codeword.

18. The method of claim 17, further comprising:
writing the channel codeword to a channel.

19. The method of claim 18, wherein the channel comprises:
a data storage medium.

20. The method of claim 19:
wherein the data storage medium comprises a hard disk.

21. The method of claim 15, wherein producing the one error correction codeword comprises:
encoding the user data using a Reed-Solomon code.

22. The method of claim 15, wherein producing the n error detection codewords is selected from the group consisting of:
encoding the user data using a cyclic redundancy check code;
encoding the user data using a Bose-Chaudhuri-Hochquenghem code; and
encoding the user data using a Hamming code.

23. A computer program embodying instructions on computer readable medium executable by a computer, comprising:
instructions to produce n error detection codewords based on user data, wherein n is greater than one, wherein each of the n error detection codewords comprises a portion of the user data and one or more error detection bits based on the portion of the user data, and wherein errors introduced to each of the n error detection codewords can be detected using the one or more error detection bits in the error detection codeword; and
instructions to produce an error correction codeword, wherein the error correction codeword comprises the n error detection codewords and one or more error correction bits based on the n error detection codewords, and wherein errors introduced to the n error detection codewords can be corrected using the one or more error correction bits in the error correction codeword.

24. The computer program of claim 23, further comprising:
instructions to encode the one or more error correction bits using an error detection code.

25. The computer program of claim 23, further comprising:
instructions to produce a channel codeword based on the error correction codeword.

26. The computer program of claim 23, further comprising instructions to encode the user data using a Reed-Solomon code.

27. The computer program of claim 23, wherein the user data is encoded using a cyclic redundancy check code; a Bose-Chaudhuri-Hochquenghem code; or a Hamming code.

* * * * *